(12) United States Patent
Davis

(10) Patent No.: US 8,493,741 B2
(45) Date of Patent: Jul. 23, 2013

(54) SUBSEA ELECTRONICS MODULE

(75) Inventor: Julian R. Davis, Bristol (GB)

(73) Assignee: Vetco Gray Controls Limited, Bristol (GB)

( * ) Notice: Subject to any disclaimer, the term of this patent is extended or adjusted under 35 U.S.C. 154(b) by 462 days.

(21) Appl. No.: 12/479,001

(22) Filed: Jun. 5, 2009

(65) Prior Publication Data
US 2009/0303687 A1 Dec. 10, 2009

(30) Foreign Application Priority Data
Jun. 5, 2008 (GB) .................................. 0810267.5

(51) Int. Cl.
H05K 5/00 (2006.01)
H05K 1/18 (2006.01)
H01R 24/00 (2011.01)
H02G 15/14 (2006.01)

(52) U.S. Cl.
USPC ........... 361/752; 361/761; 439/631; 174/70 S

(58) Field of Classification Search
USPC ................. 361/752, 788, 792, 796, 797, 729, 361/730, 733, 735, 736, 744, 784, 790; 343/719; 220/4.02; 166/338, 339, 341, 350; 162/338, 339, 341, 350; 439/61, 74, 631; 174/70 S
See application file for complete search history.

(56) References Cited

U.S. PATENT DOCUMENTS

| | | | | |
|---|---|---|---|---|
| 4,485,398 A * | 11/1984 | Chapin et al. | ..................... | 348/81 |
| 4,528,615 A * | 7/1985 | Perry | ............................ | 361/722 |
| 4,797,783 A * | 1/1989 | Kohmoto et al. | ............. | 361/695 |
| 4,922,199 A * | 5/1990 | Fukui et al. | .................... | 361/784 |
| 4,928,206 A * | 5/1990 | Porter et al. | ................... | 361/699 |
| 5,105,337 A | 4/1992 | Bitller et al. | | |
| 5,150,279 A * | 9/1992 | Collins et al. | ............ | 361/679.53 |
| 6,422,315 B1 * | 7/2002 | Dean | ............................. | 166/339 |
| 6,778,389 B1 * | 8/2004 | Glovatsky et al. | ............ | 361/690 |
| 7,196,838 B2 * | 3/2007 | Adams et al. | .................. | 359/333 |
| 2003/0033463 A1 * | 2/2003 | Garnett et al. | ................. | 710/300 |
| 2006/0176677 A1 | 8/2006 | Glovatsky et al. | | |

FOREIGN PATENT DOCUMENTS

| | | |
|---|---|---|
| EP | 0437839 A2 | 7/1991 |
| EP | 2019525 A2 | 1/2009 |
| WO | WO 2006/076758 A1 | 7/2006 |

OTHER PUBLICATIONS

Office Action includes definition of "motherboard" from online sources Google.com (Nov. 29, 2012).*
Office Action includes definition of "bay" from online sources Merriam-Webster.com (Nov. 29, 2012).*
European Search Report and Written Opinion issued in connection with EP Application Na 09158503.4, Aug. 12, 2010.
ABB Offshore Systems, "Overview of Subsea Electronics Module (SEM) Capabilities," Lombito Tomboco Presentation, Jun. 3, 2003.

* cited by examiner

Primary Examiner — Timothy Thompson
Assistant Examiner — Roshn Varghese
(74) Attorney, Agent, or Firm — Bracewell & Giuliani LLP

(57) ABSTRACT

A Subsea Electronics Module for a well installation, comprising:
a housing;
at least two printed circuit boards having control circuitry provided thereon; and
a communications component for enabling communication between the control printed circuit boards;
wherein the module further comprises a communications handling board operatively connected to the printed circuit boards, the communications component being mounted on the communications handling board.

20 Claims, 1 Drawing Sheet

SUBSEA ELECTRONICS MODULE

CROSS-REFERENCE TO RELATED APPLICATION

This application claims priority to United Kingdom Patent Application No. 0810267.5, filed Jun. 5, 2008.

FILE OF INVENTION

This invention relates to Subsea Electronics Modules (SEMs) for well installations. Despite the name, such modules are employed in well installations both subsea and in freshwater environments.

BACKGROUND OF INVENTION

The control of underwater fluid extraction wells, for example subsea hydrocarbon production wells, is managed by a Subsea Electronics Module (SEM) which is typically housed in a Subsea Control Module (SCM). This in turn is conventionally mounted on a subsea Xmas tree located on the sea bed, above the fluid extraction well. Existing SEMs contain a number of printed wiring boards which perform dedicated functions, such as the operation of hydraulic Directional Control Valves (DCVs). The body of the SEM is typically a metal cylinder of circular cross-section designed to handle the substantial pressure of the environment. This houses well control printed circuit electronic boards, located on connectors mounted on a motherboard, which facilitates connections to input and output connectors at the end of the module as well as the feeding of power supplies from a power supply unit which is typically mounted at the other end of the module. Modern SEMs utilise Ethernet communication between the boards, which requires Ethernet switches to be mounted on each circuit board taking up valuable board area. Because the boards are rectangular, as the most cost effective arrangement, typically the space between the top of the boards and the cylindrical SEM is wasted. Furthermore, there is little space left for any additional components which may be needed, for example control circuitry. In addition, known systems suffer from crosstalk between the Ethernet communications components and the input/output and power feeds, due to the provision of communication electrical connections on the motherboard.

SUMMARY

It is an aim of the present invention to overcome the above problems associated with conventional electronics modules. This aim is achieved by locating the communications components, such as Ethernet switching electronics (known as blades), not on the printed circuit boards used for well control circuitry, but on additional printed wiring boards mounted above the well control printed circuit boards, and interfacing with them via connectors. This utilises the space between the top of each control board and the SEM body, facilitates communication between the boards, reduces the complexity of the motherboard, and substantially reduces crosstalk between the Ethernet communications and the input/output and power feeds, since the communication 'wiring' is removed from the motherboard.

In accordance with the present invention there is provided a Subsea Electronics Module for a well installation as set out in the accompanying claims.

BRIEF DESCRIPTION OF THE DRAWINGS

The invention will now be described, by way of example, with reference to the accompanying drawings, in which:

FIGS. 1a to 1c show various views of a SEM according to the present invention.

DETAILED DESCRIPTION OF THE INVENTION

Figure 1A:
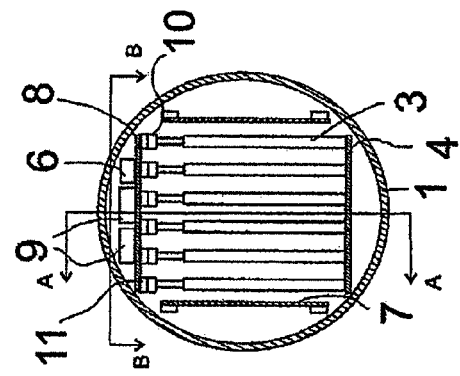
FIG. 1a schematically shows a cross-sectional view of a SEM in accordance with the present invention.
Figure 1B:
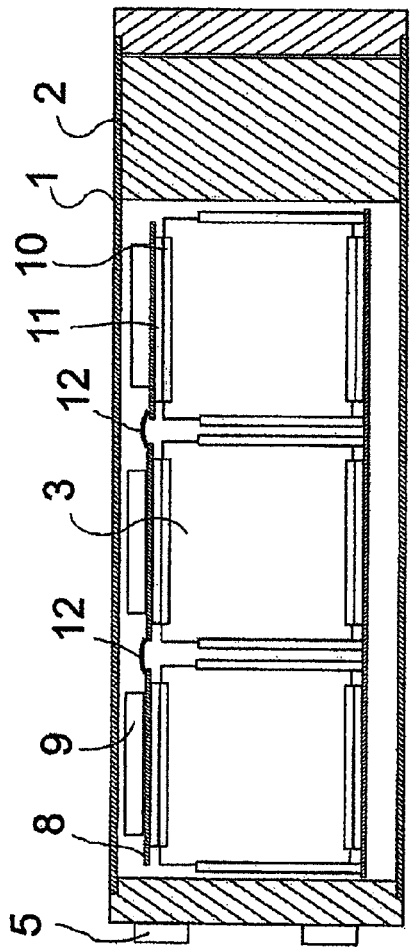
FIG. 1b shows the SEM of FIG. 1a along the line A-A.
Figure 1C:
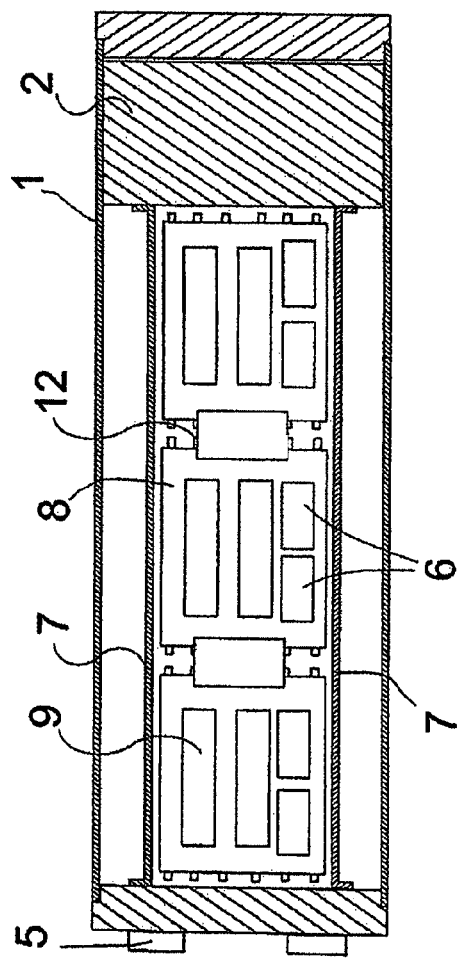
FIG. 1c shows the SEM of FIG. 1a along the line B-B.

The SEM has a generally cylindrical housing 1, which houses at one end thereof electronic power supplies 2. Also contained within housing 1 is a motherboard 4 with a plurality of parallel stacked printed circuit boards (PCBs) 3 mounted thereon. The motherboard 4 connects electrical supplies from the power supplies 2 and signal inputs and outputs to and from SEM external interface connectors 5 to the PCBs 3. The number of PCBs 3 housed in the SEM is variable and dependent on the complexity of the well installation. The example shown in FIG. 1 shows a configuration of three bays positioned along the main axis of the SEM, each bay having six PCBs 3, making a total of eighteen. The PCBs 3 are supported by a machined metal frame 7, with the PCBs mounted between "rungs" of the frame 7 (not shown). Frame 7 also serves to provide thermal connections for the PCBs 3 and communications handling boards 8.

A communications handling PCB 8 is provided at each bay, arranged to lie in a plane orthogonal to those of the PCBs 3 and proximate to top ends thereof, such that each board 8 extends over an area approximately corresponding to, and overlying, the width and depth of the respective stack of PCBs 3. In other words, top ends of each PCB 3 are approximately equidistant from a respective board 8. Boards 8 are connected to PCBs 3 via connectors 10 fitted to top ends of each of the PCBs 3, and respective connectors 11 mounted on the communications handling PCBs 8 for communication with respective connectors 10. This arrangement provides an interface between the PCBs 3 and the communications handling PCBs 8.

In the arrangement shown, a separate communication handling board 8 is used for each stack of six boards 3, i.e. one handling board 8 is provided per bay, which facilitates assembly and repair. Electrical connections between the boards 8 are achieved by links 12, which in the embodiment shown comprise printed flexible or semi-rigid links.

High power devices 6, which require substantial heat removal, are mounted directly onto the communications handling boards 8.

Communication between the PCBs 3 is achieved by providing the communications handling boards 8 with inter-board communications devices, such as Ethernet switch blades (ESBs) 9. In the embodiment shown, eight-port switches are provided for each ESB 9 to enable point to point connection to each of the six bay-hosted PCBs and to enable each bay to be connected to its adjacent bay(s), i.e. six ports assigned as hosted board connections, and two ports assigned as bay to bay connections.

Contrary to conventional, prior art arrangements, with the present inventive arrangement the communication components are removed from the PCBs 3 and mounted instead on communications handling boards 8. This produces several advantages over prior art arrangements. For example:

i) Greater real estate is created on PCBs 3 for control functions;
ii) The space between the top of the PCBs 3 and the cylindrical housing 1 of the SEM is utilised effectively. This enables minimisation of the volume of the SEM, which is important to well operators;

iii) Communication signals, generally at high switching speeds, are physically separated from both input/output signals and power supplies, since they are, contrary to conventional arrangements, no longer included in the motherboard. This reduces the complexity of the motherboard and substantially reduces crosstalk between the communications and control systems; and iv) The locations of the ESBs 9 permit heat to be directly exported from the plug-in ESBs to the SEM housing 1 via the SEM chassis protective covers (not shown).

The invention claimed is:

1. A subsea electronics module (SEM) to provide control functions for a subsea control module (SCM) for a subsea well installation, the SEM comprising:
    a housing enclosing components of the SEM defining an SEM housing, the SEM housing having a circular cross-section;
    at least two printed circuit boards enclosed within the SEM housing and having control circuitry provided thereon configured to perform certain dedicated functions for controlling a subsea control module of a subsea well installation, the printed circuit boards arranged in parallel in a stack;
    a communications handling board enclosed within the SEM housing and operatively connected to the printed circuit boards, the communications handling board being arranged to lie in a plane orthogonal to the stack of printed circuit boards; and
    a communications component for enabling communication between the printed circuit boards, the communications component being mounted on the communications handling board, the communications component comprising an Ethernet switch positioned on a surface of the communications handling board facing an inner surface of the housing between the respective surface of the communications handling board and the inner surface of the SEM housing, adjacent the inner surface of the housing to provide direct heat export to the SEM housing.

2. A subsea electronics module according to claim 1, wherein the stack of printed circuit boards is located in a bay of the SEM, and wherein the stack comprises at least three printed circuit boards.

3. A subsea electronics module according to claim 2, wherein the bay is a first bay, the module further comprising an additional stack of parallel arranged printed circuit boards enclosed in the housing and located in a respective additional bay, offset along the major axis of the SEM from the first bay.

4. A subsea electronics module according to claim 3, comprising an additional such communications handling board enclosed in the housing and operatively connected to the printed circuit boards of the additional stack and arranged to lie in a plane orthogonal to the additional stack, the additional communications handling board having an additional such communications component mounted on it.

5. A subsea electronics module according to claim 3, wherein the communications component comprises means for communicating both between printed circuit boards within a stack, and between printed circuit boards in respective bays.

6. A subsea electronics module according to claim 1, wherein the Ethernet switch is positioned to provide for inter-printed circuit board communications.

7. A subsea electronics module according to claim 6, further comprising a high-power device mounted on the communications handling board.

8. A subsea electronics module according to claim 1, wherein the Ethernet switch comprises an Ethernet switch blade.

9. A subsea electronics module (SEM) to provide control functions for a subsea control module (SCM) for a subsea well installation, the SEM comprising:
    a housing enclosing components of the SEM defining an SEM housing;
    a plurality of printed circuit boards enclosed within the SEM housing and each having control circuitry provided thereon configured to perform certain dedicated functions for controlling an SCM of a subsea well installation, the printed circuit boards arranged in parallel in a stack;
    a communications handling board enclosed within the SEM housing and operatively connected to the printed circuit boards, the communications handling board being arranged to lie in a plane orthogonal to the stack of printed circuit boards; and
    a communications component configured to provide communications between the printed circuit boards, the communications component comprising an Ethernet switch being mounted on a surface of the communications handling board facing the inner surface of the SEM housing and between the respective surface of the communications handling board and the inner surface of the housing, adjacent the inner surface of the SEM housing to provide direct heat export to the SEM housing.

10. A subsea electronics module according to claim 9, wherein the Ethernet switch comprises an Ethernet switch blade.

11. A subsea electronics module (SEM) to provide control functions for a subsea control module (SCM) for a subsea well installation, the SEM comprising:
    a housing enclosing components of the SEM defining an SEM housing;
    a plurality of printed circuit boards enclosed within the SEM housing and each having a first end and a second end opposite the first end and control circuitry provided thereon configured to perform certain dedicated functions for controlling an SCM of a subsea well installation, the plurality of printed circuit boards arranged in parallel in a stack;
    a motherboard operably enclosed within the SEM housing and connected to each of the plurality of printed circuit boards, the motherboard being arranged to lie in a plane orthogonal to the stack of printed circuit boards, the first end of each of the plurality of circuit boards connected to the motherboard;
    a communications handling board enclosed within the SEM housing and connected to each of the plurality of printed circuit boards, the communications handling board being arranged to lie in a plane orthogonal to the stack of printed circuit boards, the second end of each of the plurality of printed circuit boards connected to the communications handling board; and
    a communications component positioned to enable communication between the printed circuit boards, the communications component being mounted on the communications handling board, the communications component comprising an Ethernet switch, the communications handling board being positioned within the SEM housing such that the Ethernet switch is located adjacent an inner surface of the SEM housing to facilitate direct heat export to the SEM housing.

12. A subsea electronics module according to claim 11, wherein the stack of printed circuit boards is located in a bay of the SEM.

13. A subsea electronics module according to claim 12, wherein the bay is a first bay, wherein the stack of parallel arranged printed circuit boards is a first stack of parallel arranged printed circuit boards, and wherein the module further comprises:
 a second bay; and
 a second stack of parallel arranged printed circuit boards located in the respective second bay, offset along the major axis of the SEM from the first bay.

14. A subsea electronics module according to claim 13,
 wherein the communications handling board is a first communications handling board; and
 wherein the second stack of parallel arranged printed circuit boards is connected between the motherboard and the second communications handling board.

15. A subsea electronics module according to claim 11, wherein the Ethernet switch is positioned to provide for inter-printed circuit board communications.

16. A subsea electronics module according to claim 11, wherein the Ethernet switch comprises an Ethernet switch blade.

17. A subsea electronics module according to claim 11, wherein the Ethernet switch provides inter-printed circuit board communications, and wherein each of the plurality of parallel arranged printed circuit boards is devoid of any components having a higher heat removal requirement than a heat removal requirement of the Ethernet switch positioned on the communications handling board.

18. A subsea electronics module according to claim 11, further comprising:
 a metal frame positioned adjacent inner surface portions of the housing and configured to provide a thermal connection thereto for one or more of the plurality of parallel arranged printed circuit boards and the communications handling board.

19. A subsea electronics module according to claim 18, wherein the metal frame comprises a pair of parallel metal plates, each metal plate located parallel to the stack, the stack being positioned between the pair of parallel metal plates.

20. A subsea electronics module according to claim 18, further comprising:
 an SEM external interface attachment having a plurality of connectors; and
 a power supply;
 wherein the metal frame is connected to and extends between the SEM external interface attachment and the power supply.

* * * * *